(12) United States Patent
Wildhagen et al.

(10) Patent No.: US 10,938,968 B2
(45) Date of Patent: Mar. 2, 2021

(54) HARMONIZED DATA FOR ENGINEERING SIMULATION

(71) Applicant: SAP SE, Walldorf (DE)

(72) Inventors: Andreas Wildhagen, Wiesloch (DE); Chatur B. Patil, Wiesloch (DE); Lars Erbe, Stutensee (DE); Andre Pany, Bad Friedrichshall (DE); Samir Zeort, Waldorf (DE)

(73) Assignee: SAP SE, Walldorf (DE)

( * ) Notice: Subject to any disclaimer, the term of this patent is extended or adjusted under 35 U.S.C. 154(b) by 0 days.

(21) Appl. No.: 16/209,256

(22) Filed: Dec. 4, 2018

(65) Prior Publication Data
US 2020/0177712 A1 Jun. 4, 2020

(51) Int. Cl.
| | |
|---|---|
| *H04J 3/24* | (2006.01) |
| *H04L 29/08* | (2006.01) |
| *H04L 12/861* | (2013.01) |
| *G06F 16/25* | (2019.01) |
| *G06F 9/54* | (2006.01) |
| *G06F 9/445* | (2018.01) |
| *G06F 30/20* | (2020.01) |

(52) U.S. Cl.
CPC ............ *H04L 69/324* (2013.01); *G06F 9/542* (2013.01); *G06F 16/258* (2019.01); *H04L 49/90* (2013.01); *G06F 9/445* (2013.01); *G06F 30/20* (2020.01); *H04L 67/12* (2013.01)

(58) Field of Classification Search
CPC ....... H04L 69/324; H04L 49/90; H04L 67/12; G06F 9/542; G06F 16/258; G06F 30/20; G06F 9/445

USPC .......................................... 370/389, 392, 474
See application file for complete search history.

(56) References Cited

U.S. PATENT DOCUMENTS

| | | | |
|---|---|---|---|
| 10,747,595 B2* | 8/2020 | Wildhagen | G06F 9/44505 |
| 2013/0290321 A1* | 10/2013 | Shapira | G06F 16/951 707/723 |
| 2016/0142963 A1* | 5/2016 | Salkintzis | H04W 40/02 370/329 |
| 2017/0068579 A1* | 3/2017 | Franklin | G06F 9/546 |
| 2017/0093950 A1* | 3/2017 | Trani | H04L 65/602 |
| 2019/0258553 A1* | 8/2019 | Misumi | G06F 11/3003 |
| 2020/0174858 A1* | 6/2020 | Wildhagen | G06F 8/10 |

* cited by examiner

*Primary Examiner* — Chuong T Ho
(74) *Attorney, Agent, or Firm* — Mintz Levin Cohn Ferris Glovsky and Popeo, P.C.

(57) ABSTRACT

Computer-implemented systems and methods for data harmonization in engineering simulation. The method may comprise receiving application preferences defining attributes associated with input data to be delivered to one or more applications from one or more data sources. A first set of attributes may be associated with data to be delivered to a first application. Application preferences may be provided to a handler in communication with the data sources. Raw data received by the handler may arrive in a variety of formats and packet sizes from the one or more data sources. Raw data may be packaged by the handler into one or more data packets having a size or format that satisfies the application preferences. One or more attributes associated with input data to be delivered to the first application may be defined. Packaged data may be transmitted over one or more data transmission channels satisfying the application preferences.

20 Claims, 4 Drawing Sheets

HARMONIZED DATA FOR ENGINEERING SIMULATION

TECHNICAL FIELD

The disclosed subject matter generally relates to simulation technology and more particularly to collecting and configuring raw event or sensor data in a harmonized manner for use by applications that consume the event or sensor data.

BACKGROUND

Advancements in computing and communications technology have made it possible to develop computerized models that are digital simulations of real life systems or structures. For example, using sensors to monitor different aspects of a bridge, an industrial plant or a medical monitoring system, a variety of data may be captured about different elements and dynamics of such systems and how related elements interact or affect other internal and external relationships.

SUMMARY

For purposes of summarizing, certain aspects, advantages, and novel features have been described herein. It is to be understood that not all such advantages may be achieved in accordance with any one particular embodiment. Thus, the disclosed subject matter may be embodied or carried out in a manner that achieves or optimizes one advantage or group of advantages without achieving all advantages as may be taught or suggested herein.

In accordance with some implementations of the disclosed subject matter, computing systems and methods for data harmonization in engineering simulations are provided. The method may comprise receiving application preferences defining one or more attributes associated with input data to be delivered to one or more applications from one or more data sources. A first set of attributes may be associated with data to be delivered to a first application. Application preferences may be provided to a handler in communication with the one or more data sources. Raw data received by the handler may arrive in a variety of formats and packet sizes from the one or more data sources. Raw data may be packaged by the handler into one or more data packets having a size or format that satisfies the application preferences. One or more attributes associated with input data to be delivered to the first application may be defined. Packaged data may be transmitted over one or more data transmission channels based on the application preferences.

A computer-implemented system, in accordance with one or more embodiments, may comprise one or more controllers or processors for collecting a plurality of event data generated by a plurality of sensors coupled to a plurality of elements in an event-producing system, the collecting being in real-time or near real-time. Categorized event data may be streamed, in real-time or near real-time, over a plurality of channels to a plurality of subscribers, the streaming being by way of a publish/subscription mechanism, such that selected event data from among the plurality of event data may be received by a first set of subscribers from among the plurality of subscribers over the plurality of channels. The first set of subscribers may detect one or more triggering events from the selected event data received by the first set of subscribers; and invoke at least one process to perform a first set of actions based on the one or more triggering events.

The first set of actions may comprise at least one of generating a sensory notification based on analysis of event data associated with the one or more triggering events, or performing a detailed analysis of event data associated with the one or more triggering events that is more resource-intensive or more comprehensive than an analysis performed on the event data prior to detecting the one or more triggering events. The streamed categorized event data may be buffered in at least a first storage media associated with a first data transmission channel corresponding to the process invoked to perform the first set of actions.

The categorized event data may be packaged according to a first timeline enveloping a second timeline defined by one or more attributes of an application subscribing to a channel over which the categorized event data is published. The first timeline may be associated with a span in time starting at a time T1 and ending at a time T4, wherein T4 is greater than T1. The second timeline may be associated with a span in time starting at a time T2 and ending at a time T3, wherein T4 is greater than T3, wherein T3 is greater than T2, and wherein T2 is greater than T1.

The details of one or more variations of the subject matter described herein are set forth in the accompanying drawings and the description below. Other features and advantages of the subject matter described herein will be apparent from the description and drawings, and from the claims. The disclosed subject matter is not, however, limited to any particular embodiment disclosed.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations as provided below.

Where practical, the same or similar reference numbers denote the same or similar or equivalent structures, features, aspects, or elements, in accordance with one or more embodiments.

DETAILED DESCRIPTION OF EXAMPLE IMPLEMENTATIONS

Figure 1:
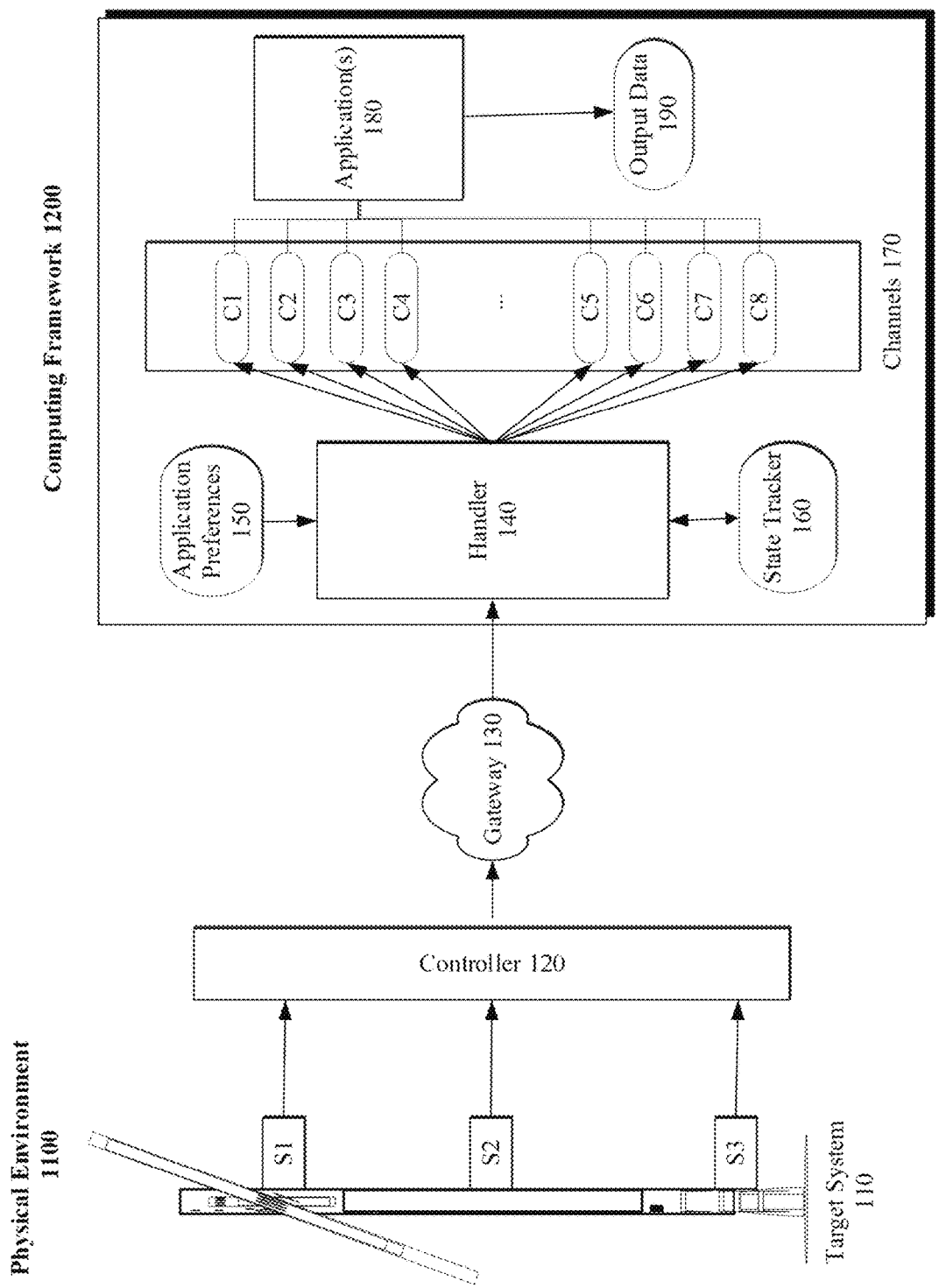
FIG. 1 illustrates example physical environment and computing framework, in accordance with one or more embodiments, wherein collected data may be harmonized for use by one or more applications.

In the following, numerous specific details are set forth to provide a thorough description of various embodiments. Certain embodiments may be practiced without these specific details or with some variations in detail. In some instances, certain features are described in less detail so as not to obscure other aspects. The level of detail associated with each of the elements or features should not be construed to qualify the novelty or importance of one feature over the others.

Depending on implementation, data may be captured over a dedicated course of time or the lifespan of a target system by way of processing signals generated by sensors positioned, connected or otherwise associated with various parts of the system. Using such monitoring technology, it is possible to collect vast amounts of data about the target system. The collected sensor data or signals may in turn be utilized for the purpose of simulation, detecting and preventing faults or to better understand certain system operations and functionalities.

Sensor data may be stored and provided as input to simulation applications. The data may be stored or may originate from different data sources, such as files in a file system or device data streams. Data from different data sources is usually formatted differently (e.g., CSV, Avro, JSON, etc.). Further, depending on the data source, data packaging may be provided in different payload sizes and time windows. Even further, communication channels utilized for delivery and data transmission may be configured according to different sequencing requirements.

To be useful to an application that receives the data for processing, the above-noted variety of factors associated with data formatting, sourcing and delivery may need to be managed by way of reliance on expertise in systems integration and engineering so that a receiving application can process the data. Due to the overhead associated with processing data originated from different sources with different formatting and packaging, the cost and effort for developing applications that may successfully utilize such data is very high. Enhanced computing systems and technological improvements are needed that can help overcome the above deficiencies.

Computer-implemented systems and methods are thus provided, in accordance with one or more embodiments, for receiving application preferences that define one or more attributes associated with input data to be delivered to one or more applications from one or more data sources. The one or more data sources may include one or more sensors configured to capture event data generated by an event producing system. In one example, a first set of attributes may be associated with data to be delivered to a first application and a second set of attributes may be associated with data to be delivered to a second application. Data arrived in a variety of formats and packet sizes from one or more data sources may be packaged, according to the defined attributes, into one or more data packets. The packaged data may be transmitted over one or more data transmission channels that satisfy the first application's preferences, as provided in further detail below.

The transmitted packaged data, in certain implementations, may be buffered in at least a first storage media associated with a first data transmission channel corresponding to the first application invoked to process the transmitted packaged data. The data may be packaged according to a first timeline enveloping a second timeline, defined by the one or more attributes, wherein the first application processes the data in the second timeline and further processes the data in the non-overlapping portion of the first and second timelines on an as needed basis. Additional data may be packaged according to a third timeline enveloping a fourth timeline, wherein there is an overlap between the first timeline and the third timeline. The timelines associated with packaging the data received and transmitted may be synchronized according to timing data defined by the one or more attributes. As provided in further detail below, the packaged data may be transmitted over one or more data transmission channels by way of a publication/subscription mechanism.

Referring to FIG. 1, example physical environment 1100 and computing framework 1200 are illustrated. As shown, the physical environment 1100 may include a target system 110 such as an event-producing system (e.g., a wind turbine) that may be in communication with computing framework 1200 by way of controller 120 and gateway 130. The target system 110 may be instrumented with monitoring or sensor devices (e.g., S1, S2, S3). The monitoring devices may generate signals or event data that provide information about the state of certain elements of target system 110. For example, the provided information may include, without limitation, event data associated with a physical, functional, environmental or operational state of a component of the target system 110. The provided information may be referred to hereafter as raw sensor data or event data.

The provided information or generated event data may be transmitted to controller 120 for the purpose of analysis, storage and further transmission. In example embodiments, controller 120 may be a machine or system implemented in hardware, software, or a combination of the two, where controller 120 manages the receiving of event data from one or more sources (e.g., S1, S2, S3), stores the data in data storage media (not shown) and transmits the data over to a handler 140 in computing framework 1200 byway of gateway 130. The gateway 130 may be a component of a communications network that, optionally, provides for the secure transmission of data from controller 120 to handler 140 and may be implemented over a local or remote communications network. In some variations, controller 120 or the gateway 130 may be components of a cloud storage system or service.

In accordance with one aspect, one or more applications 180 may be invocable or instantiable in computing framework 1200 for the purpose of processing event data generated by one or more sources in target system 110. At noted earlier, however, raw sensor data or event data may be generated in a variety of formats and configurations. For example, S1 may generate data in format A, S2 may generate data in format B and S3 may generate data in format C. Further, each data source may generate data in different packet sizes. Such data formats and packets sizes may not be compatible with one or more applications 180 executing in computing framework 1200. Reformatting and converting the data generated by a multitude of sources by each application 180 may require a substantial programming overhead and may be time consuming and also expensive.

To help reduce an undesirable application overhead, advantageously computing framework 1200 may be implemented to include one or more of handler 140, application preferences 150, state tracker 160 and channels 170. As shown in FIG. 1, the handler 140 may have access to application preferences 150 which provides handler 140 with policy, configuration or preference information (e.g., data formatting policies, data source and destination bindings, etc.) for the one or more applications 180. The handler 140 may be also in communication with a state tracker 160 configured to synchronize data transmission to the one or more applications 180 based on timeline data associated with event data packaged by handler 140. Channels 170 may be communication mechanisms (e.g., data buffers, temporary storage, data subscription nodes, etc.) that may be implemented to transmit data suitable for consumption by the one or more applications 180.

Figure 2:
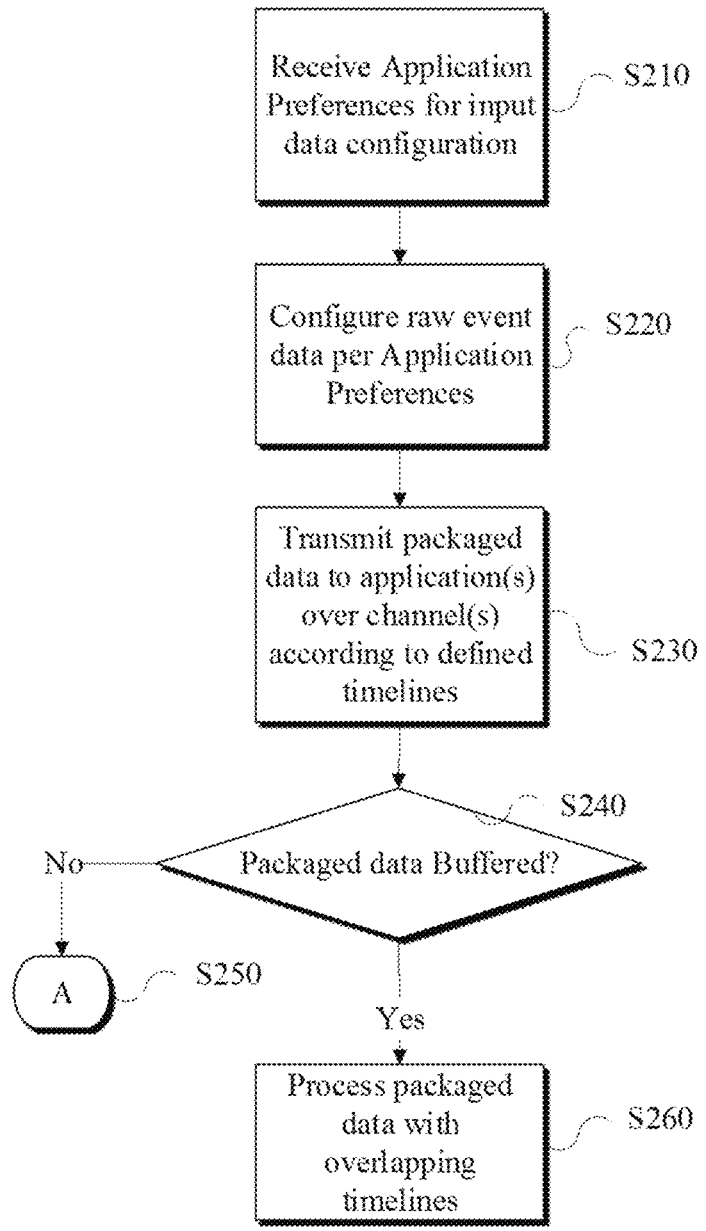
FIG. 2 is an example flow diagram of a method of harmonizing collected data, in accordance with one or more implementations.

Referring to FIGS. 1 and 2, the handler 140 may receive information provided by an application preferences 150 component, where the received information defines configurations for input data to one or more applications 180 (S210). For example, suitable data for consumption by one or more applications 180 may be defined by a declaration or descriptor in the application itself or by way of a proxy that defines the application's 180 required or preferred attributes for input data. For instance, application preferences 150 may define preferred attributes associated with type, format, time window or size of data that handler 140 may transmit for the purpose of input to a particular application. By way of example, the application 180 may declare a configuration as follows:

| | |
|---|---|
| "windowConfig": { | "processingDuration": 60, |
| | "beforeDuration": 10, |
| | "afterDuration": 10 } |

In the above example, application works on 60 seconds of event data and to smoothen the data, application may require 10 seconds of data before and after the indicated processing duration. In some scenarios, raw event data received by handler 140 may not match particularly defined requirements or preferences for a corresponding application. For example, sensor data generated by S1 may be received in data packets or chunks that are 30 seconds long, or sensor data generated by S2 may be received in chunks that are 180 seconds long. Accordingly, handler 140 may configure the raw event data per application's preferences as define in application preferences 150 (S220).

In the above example, to produce 60-second chunks, handler 140 may package two 30-second chunks from S1 into a single 60-second data packet. Based on the same logic, handler 140 may split a 180-second chunk from S2 into three single 60-second data packets. In this manner, raw event data received from sources S1 and S2 may be converted into data packets that are consumable by application 180 without application 180 having to perform such conversion. In other words, the conversion and the associated overhead, which would have been a burden on the application, may be managed by handler 140 or other components of computing framework 1200 without interfering with the application's normal processing cycle.

It is noteworthy that the above simplified example is provided for the purpose of illustration and, in one or more scenarios, additional policy and configuration preferences may be considered to convert or manage the delivery of raw event data as may be needed prior to transmitting the data to the one or more applications 180. For example, application preferences 150 may provide that application preference is to receive event data in .JSON format. As another example, application preferences 150 may identify the source and destination bindings for data retrieval and storage (e.g., local file system, cloud storage, streaming data, etc.) Thus, raw event data received by handler 140 may be converted and accordingly packaged for input. Once raw event data is reconfigured and properly packaged according to application preferences 150, the packaged data is transmitted by handler 140 to one or more applications 180 over channels 170 (S230).

Depending on implementation, one or more publication/subscription (pub/sub) mechanisms may be utilized for the purpose of linking or binding different channels to different applications 180. Such transmission mechanisms may allow for reduced application overhead for ingesting and consuming vast amounts of data generated by sensors coupled to variety of elements in one or more target systems 110. For example, an application 180 may subscribe to those channels (e.g., C1, C3 and C7) that carry or store the data that the application may be interested in, in contrast to having to listen and sort through a large volume of data received (e.g., over channels C1 through C8) as generated by a plurality of sources or sensors. In other words, a pub/sub mechanism allows for a one-to-one linking of a particular data channel to a particular application, where the linked channel carries the data that is interesting to the subscriber application in preferred formats and configurations according to one or more policies and bindings defined in application preferences 150.

Referring back to FIG. 2, application may periodically check a subscribed channel to determine if newly arrived packaged data is buffered in the channel for consumption (S240). If not, the application 180 may continue to wait (S250). Otherwise, the application 180 may process the packaged data (S260) and may generate output data 190. In accordance with example embodiments, the packaged data may be processed with overlapping timelines, as suggested earlier, for a variety of purposes, including additional data reliability and processing stability. For example, if data processed by one or more applications 180 during a target timeframe includes indications of an anomaly (e.g., an indication of an outlier event taking place in the processed timeframe), the application 180 may be implemented to process event data included in earlier or later timeframes (e.g., historic data or data in a header or tail portion of the packaged data in a timeline) to account for such anomaly.

Referring to the example scenario provided earlier, the application 180 may process 60 seconds of data and produce output for 60 seconds. In one implementation, 10 seconds of data before and after the processing duration may be utilized. For example, if handler 140 has received data for 300 seconds, the data may be divided as provided below.

Chunk-1: 0-80 seconds, process and produce output for seconds 10-70.
Chunk-2: 60-140 seconds, process and produce output for seconds 70-130.
Chunk-3: 120-200 seconds, process and produce output for seconds 130-190.
Chunk-3: 180-260 seconds, process and produce output for seconds 190-250.

If the handler 140 further receives at least next 20 seconds of data, for example, until second 320, then the handler 140 may form the next chunk.

Chunk-4: 240-320 seconds, process and produce output for seconds 250-310.

Considering a different example scenario, with the same time window configuration above, and assuming the handler 140 has transmitted and the application has processed data until 12 pm (noon), a next data set received may be 20 seconds (e.g., until 12:00-12:00:20), with which the handler 140 cannot form a subsequent data package based on the preferred timeline length defined by the application (e.g., data packet with a contiguous window of 80 seconds of data). Thus, the handler 140 may wait to receive the next 20 seconds of data (e.g., until 12:00:40). However, with this additional amount of data, the handler 140 still may be unable to form a data package that satisfies the preferred time window defined by application.

Accordingly, in the above example, handler 140 may wait longer until additional data is received. In one example scenario, additional data may be received after passage of 5 hours (e.g., at 17:00 or 5 pm) for an additional 30 seconds (e.g., 17:00:30). The handler 140 may still be unable to form a contiguous window of 80 seconds under such scenario and may still wait longer. If the handler 140 receives additional data for 50 seconds after the last time window (e.g., 17:01:20), then handler 140 may use data in the last chunk received to construct a data package for transmission to application with an 80-second contiguous window from 17:00:00 to 17:01:20, for example.

In example applications, the systems and methods disclosed herein may be applied to monitor events generated in a wind turbine. In such example, sensory data generated from various structural elements of a wind turbine may be collected for the purpose of fault detection or loss prevention (e.g., fatigue analysis). Triggering events may be detected for instance by defining thresholds on bending movements (e.g., by placing virtual sensors at predetermined locations, i.e., "hot spots," on the wind turbine). If a threshold is met, a triggering event (e.g., "Strong Bending Moment Event") may be detected. Depending on the level of details or amount of event data collected, additional information (e.g., NORMAL, MEDIUM, HIGH, CRITICAL) may be provided to a human operator, for example, to indicate the importance, urgency or sensitivity of a detected event.

In the above example, in addition to providing detected or collected virtual sensor values for one or more hot spots or structural elements in the wind turbine, a batch application may be invoked to compute intensive element analysis and produce a complete data set for a window of time (e.g., 30 or 60 seconds) around the time when the triggering event or events occurred. The complete dataset may be utilized to provide, for example, a three-dimensional (3D) visualization to help a human operator or a machine to properly detect and access the detected situation and take appropriate action.

The above methodology provides for a timely invocation of one or more batch processes with a focus on a target data set or series of event, and desirably based on rules that define a meaningful slice in time for detection or analysis. Such approach provides for the capability to timely and efficiently address captured triggering events associated with large volumes of collected event data, particularly when such events are, for example, critical, important or otherwise interesting. In one aspect, less important or less interesting streams of data (at the time) may be overlooked (e.g., not processed or process with a lower level of priority or allocation of resources)—at least for a certain time period—while other more interesting or higher priority streams of data may be analyzed in more detail and with more intensity (e.g., using a higher level or higher allocation of resources, better quality resources, or resources that are faster or more responsive).

As such, the result and the level of analysis for a triggering event may be also a matter of implementation, in that certain triggering events may require more or less resources or more or less details in order to, for example, provide a human operator or a computing system with sufficient information to make a determination about the next steps to be taken after the triggering event is detected, either in real-time, in near-real-time, or according to context and importance.

In example embodiments, simulation based methods may be implemented to collect sensor data to develop a model of one or more physical systems and use the sensor data to drive the model for continuously calculating and updating the state of the model using one or more applications 180. As provided in further detail below with respect to FIG. 3, one or more applications 180 may be deployed and executed over application framework 310, which is configured to take advantage of one or more layers of abstraction, such as abstract service layer 320. Application framework 310 may be implemented to provide an environment for application operators (e.g., operators 1 through N) to process data received from ingestion services and to provide the results to storage services. As provided in further detail with reference to FIG. 3, an application framework 310 may be implement to properly bind the services in abstract service layer 320 properly to the services in real service layer 340 for utilization by one or more applications 180.

Accordingly, in some aspects, computing elements or modules, such as operators 1 through N, defined or implemented by way of deployment or execution of one or more applications 180, are not burdened with the tasks associated with reformatting or reconfiguring input and output data or procedures associated with binding applications' 180 input and output to particular source or destination resources. In other words, an operator defined by one or more applications 180 may simply perform the calculations for which the operator is defined or instantiated, without having the overhead associated with input, output or storage configuration and formatting. As provided in further detail herein, application framework 310 may bind abstract service layer 320 services to real service layer 340 services.

Figure 3:
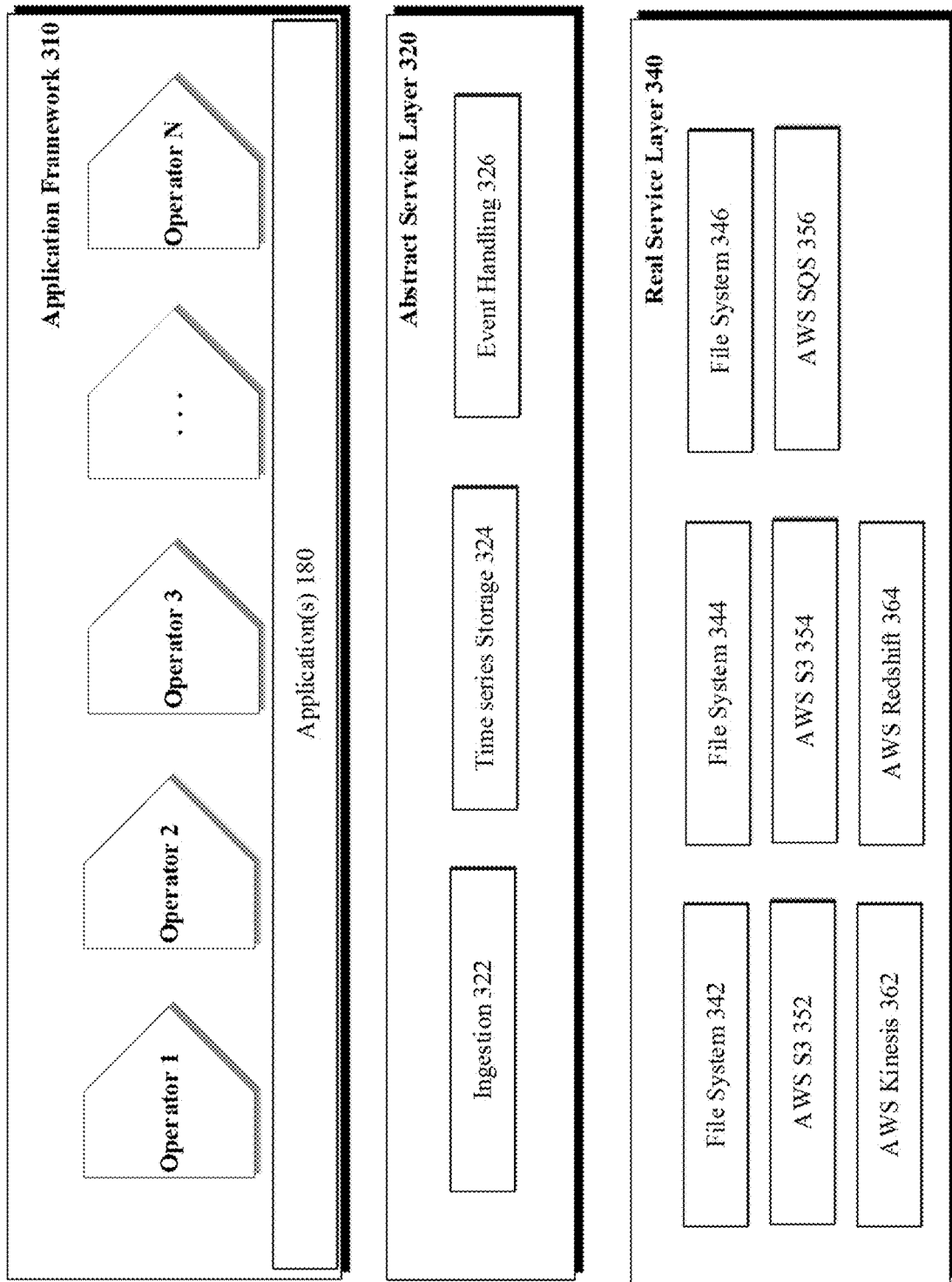
FIG. 3 is an example block diagram of an application framework implemented in accordance with one or more embodiments.

Referring to FIG. 3, by way of example, services of abstract service layer 320 may include data ingestion 322, time series storage 324, event handling 326, and other types of services that may be utilized to manage data formatting and configuration of data input or output between one or more applications 180. Services in the abstract service layer 320 may also handle the related application generated events. Real service layer 340 services may include, for example and without limitation, storage services associated with one or more file systems 342, 344, 346, Amazon Web Services (AWS) S3 352, 354, AWS Simple Que Service (SQS) 356, AWS Kinesis 362, AWS Redshift 364, AWS Kafka and other real-time or near-real-time data management and other data storage services that may be utilized to deposit data into storage devices or file systems (local or remote) or to manage data streams over local, central, distributed or cloud-based infrastructures.

In example embodiments, deployment of a computing model may include preprocessing of input data, simulation, post processing, event detection and batch analysis. Preprocessing may, for example, include signal processing with noise reduction, transformation of dimensions, unit of measures, outlier detection, data quality checks, transformation of non-equidistant time series data to equidistant time series data and the like. Simulation may, for example, involve adoption methods such as finite element analysis, multibody dynamics, fluid dynamics or a combination thereof. Post processing may, for example, include processing sensor data and virtual sensor data for key performance indicators (KPI) calculations, anomaly detection, data quality or plausibility checks.

In some variations, input and output data may be inspected for quality and consistency and for detecting situations and anomalies and for triggering compute intensive analysis and diagnostics in a batch process, for example. A batch process may be a computerized process that may primarily rely on the scripted execution of one or more programs, as directed by a job control language (JCL), with little to no human involvement. Accordingly, automated or background driven analysis may be performed, in some embodiments, by way of, for example, real-time, near-real-time, or batch driven analysis. To help further reduce the need for human involvement in coding applications for input and output formatting or for the binding of resources for the purpose of storage or processing, different representation of data sources in local execution, cloud deployment and in batch and stream mode may be automatically managed by the application framework 310.

As provided in further detail herein, application framework 310 may be utilized to simplify application development by off-loading generic tasks, such as data source handling, data windowing, data sequencing, data loss detection and data quality assurance, through standardization or harmonization of one or more of data formatting, system configuration or resource binding. For example, a programming model may be provided for the purpose of performing signal processing and adding custom code (e.g., in Python programming language) and allowing use of native libraries in conjunction with added custom code. The libraries may include code for standard functions for signal processing that may be integrated, for example, declaratively in the processing flow of one or more application operators.

One or more embodiments provide support for simulated virtual models (e.g., FEDEM models) and native support for runtime models (e.g., ANSYS digital twin models), such that the models may be properly packaged and deployed by way of integration of data processing of one or more application 180 that include declarations for operator types (e.g., FEDEM, ANSYS, etc.) with reference to, for example, data for constructing a model (e.g., data stored in a file in a file system) and potentially additional information such as parameter mapping, using an abstract type system (e.g., core data services (CDS/CDX) or open data protocol (OData)), for example.

One or more applications 180 may, for example, comprise an application descriptor (e.g., app.json) including type definitions that may be used for specifying data structures used on input or output interfaces for an application 180 and between one or more operators 1 through N. The types may be used for defining the expected input into an application 180, the output of an application 180 or the input and output of operators 1 through N. As provided in the following example, one or more applications 180 may include declarative and descriptive metadata. Metadata may be data that provides information about other data. In one aspect, a simulation application's app descriptor (e.g., app.json) may include metadata that specifies application input, operator input and output, and types from an abstract type system, for example.

Application 180, depending on implementation, may be packaged (e.g., in an almost self-contained compressed format) with one or more of a structure, descriptors, declared types, operators and configurations as provided in the example below.

Structure and Descriptor:

```
-+
 +- app.json: The app descriptor
 +- requirements.txt: Requirements to external modules
    (currently
 Python modules)
 +-+ lib: A folder comprising Python library files
   |- <lib1>.py
   |+- <lib2>.py
 +-+ config : folder with configuration files
   |-<lib1>.json
   |+-<lib2>.jsob
 +-+-data: Folder with data sets deployed with the DTS
    application
    e.g. for test automation and smoke tests
       |-input.json
```

```
 |+-...
 +-+-resources : a set of resources such as Model files
    (FEDEM:
*.fsi, ANSYS: *.twin)
    |- FEDEM.fsi
    |- ANSYS.twin
 +- ...
```

Name, Types and Operators:

```
{
  "name": "applicationConceptExemplification",
  "WindowConfig": {
  /* windows specification */
  },
  "types": {
  /* types specification */
  },
  "operators": {
  /* operators specification */
}
```

Configuration:

```
"windowConfig": {    "processingDuration": 60,
                     "beforeDuration": 10,
                     "afterDuration": 10 }
```

It is noteworthy that the above example is provided for the purpose of illustration and the scope of the disclosed subject matter should not be construed as limited to such example. In other example implementations, the lib folder may include custom software artefact, including without limitation python scripts (e.g., .py), compiled native libraries (e.g., .dll, .so), FEDEM model files (e.g., .fsi), ANSYS executable twins (e.g., .twin) and the like. Furthermore, depending on implementation, a config folder may include, without limitation, JSON files, which names correspond to operators defined in an application 180 (e.g., app.json) and may not relate to the python script names in the lib folder, for example.

The proposed implementations discussed above and as illustrated in the accompanying figures overcome the deficiencies associated with the traditional systems by invoking on time and high fidelity simulation and analysis as needed, and by focusing the amount or level of analysis and computing resources to meaningful timelines and collections of data in particularly identified categories that are closely related to particularly interesting or important contexts, for example.

Figure 4:
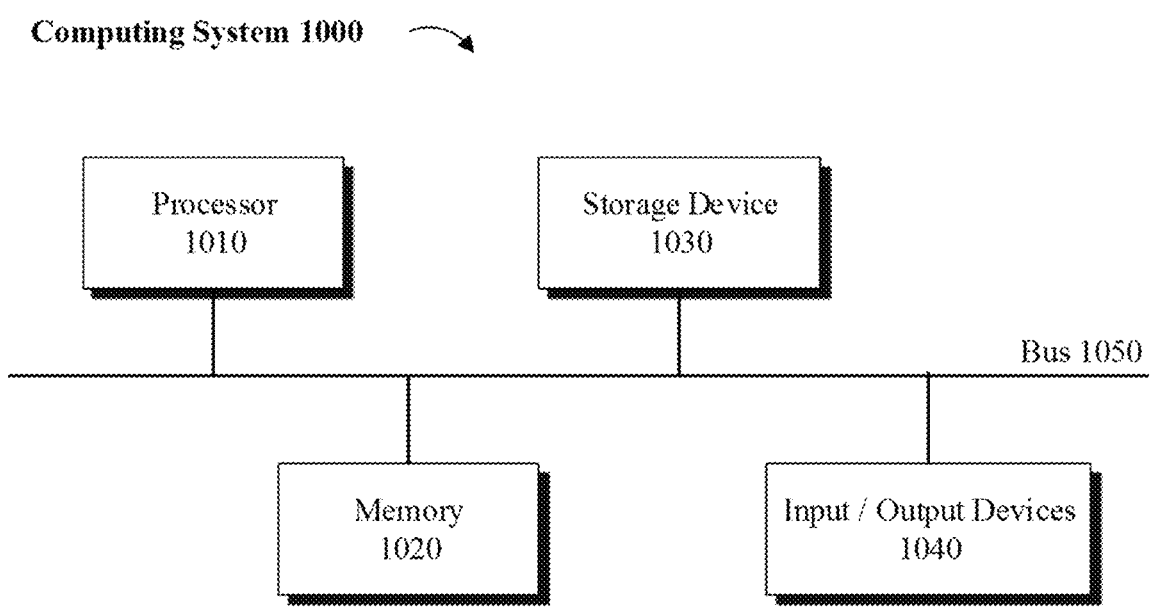
FIG. 4 is a block diagram of a computing system 1000 consistent with one or more embodiments.

Referring to FIG. 4, a block diagram illustrating a computing system 1000 consistent with one or more embodiments is provided. The computing system 1000 may be used to implement or support one or more platforms, infrastructures or computing devices or computing components that may be utilized, in example embodiments, to instantiate, implement, execute or embody the methodologies disclosed herein in a computing environment using, for example, one or more processors or controllers, as provided below.

As shown in FIG. 4, the computing system 1000 can include a processor 1010, a memory 1020, a storage device 1030, and input/output devices 1040. The processor 1010, the memory 1020, the storage device 1030, and the input/output devices 1040 can be interconnected via a system bus 1050. The processor 1010 is capable of processing instructions for execution within the computing system 1000. Such executed instructions can implement one or more components of, for example, a cloud platform. In some implementations of the current subject matter, the processor 1010 can be a single-threaded processor. Alternately, the processor 1010 can be a multi-threaded processor. The processor 1010 is capable of processing instructions stored in the memory 1020 and/or on the storage device 1030 to display graphical information for a user interface provided via the input/output device 1040.

The memory 1020 is a computer readable medium such as volatile or non-volatile that stores information within the computing system 1000. The memory 1020 can store data structures representing configuration object databases, for example. The storage device 1030 is capable of providing persistent storage for the computing system 1000. The storage device 1030 can be a floppy disk device, a hard disk device, an optical disk device, or a tape device, or other suitable persistent storage means. The input/output device 1040 provides input/output operations for the computing system 1000. In some implementations of the current subject matter, the input/output device 1040 includes a keyboard and/or pointing device. In various implementations, the input/output device 1040 includes a display unit for displaying graphical user interfaces.

According to some implementations of the current subject matter, the input/output device 1040 can provide input/output operations for a network device. For example, the input/output device 1040 can include Ethernet ports or other networking ports to communicate with one or more wired and/or wireless networks (e.g., a local area network (LAN), a wide area network (WAN), the Internet).

In some implementations of the current subject matter, the computing system 1000 can be used to execute various interactive computer software applications that can be used for organization, analysis and/or storage of data in various (e.g., tabular) format (e.g., Microsoft Excel®, and/or any other type of software). Alternatively, the computing system 1000 can be used to execute any type of software applications. These applications can be used to perform various functionalities, e.g., planning functionalities (e.g., generating, managing, editing of spreadsheet documents, word processing documents, and/or any other objects, etc.), computing functionalities, communications functionalities, etc. The applications can include various add-in functionalities or can be standalone computing products and/or functionalities. Upon activation within the applications, the functionalities can be used to generate the user interface provided via the input/output device 1040. The user interface can be generated and presented to a user by the computing system 1000 (e.g., on a computer screen monitor, etc.).

One or more aspects or features of the subject matter disclosed or claimed herein may be realized in digital electronic circuitry, integrated circuitry, specially designed application specific integrated circuits (ASICs), field programmable gate arrays (FPGAs) computer hardware, firmware, software, and/or combinations thereof. These various aspects or features may include implementation in one or more computer programs that may be executable and/or interpretable on a programmable system including at least one programmable processor, which may be special or general purpose, coupled to receive data and instructions from, and to transmit data and instructions to, a storage system, at least one input device, and at least one output device. The programmable system or computing system may include clients and servers. A client and server may be remote from each other and may interact through a communication network. The relationship of client and server arises by virtue of computer programs running on the respective computers and having a client-server relationship to each other.

These computer programs, which may also be referred to as programs, software, software applications, applications, components, or code, may include machine instructions for a programmable controller, processor, microprocessor or other computing or computerized architecture, and may be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium may store such machine instructions non-transitorily, such as for example as would a non-transient solid-state memory or a magnetic hard drive or any equivalent storage medium. The machine-readable medium may alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user can provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including acoustic, speech, or tactile input. Other possible input devices include touch screens or other touch-sensitive devices such as single or multi-point resistive or capacitive track pads, voice recognition hardware and software, optical scanners, optical pointers, digital image capture devices and associated interpretation software, and the like.

Terminology

When a feature or element is herein referred to as being "on" another feature or element, it may be directly on the other feature or element or intervening features and/or elements may also be present. In contrast, when a feature or element is referred to as being "directly on" another feature or element, there may be no intervening features or elements present. It will also be understood that, when a feature or element is referred to as being "connected", "attached" or "coupled" to another feature or element, it may be directly connected, attached or coupled to the other feature or element or intervening features or elements may be present. In contrast, when a feature or element is referred to as being "directly connected", "directly attached" or "directly coupled" to another feature or element, there may be no intervening features or elements present.

Although described or shown with respect to one embodiment, the features and elements so described or shown may apply to other embodiments. It will also be appreciated by those of skill in the art that references to a structure or feature that is disposed "adjacent" another feature may have portions that overlap or underlie the adjacent feature.

Terminology used herein is for the purpose of describing particular embodiments and implementations only and is not intended to be limiting. For example, as used herein, the singular forms "a", "an" and "the" may be intended to include the plural forms as well, unless the context clearly indicates otherwise. It will be further understood that the terms "comprises" and/or "comprising," when used in this specification, specify the presence of stated features, steps, operations, processes, functions, elements, and/or components, but do not preclude the presence or addition of one or more other features, steps, operations, processes, functions, elements, components, and/or groups thereof. As used herein, the term "and/or" includes any and all combinations of one or more of the associated listed items and may be abbreviated as "/".

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

Spatially relative terms, such as "forward", "rearward", "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features due to the inverted state. Thus, the term "under" may encompass both an orientation of over and under, depending on the point of reference or orientation. The device may be otherwise oriented (rotated 90 degrees or at other orientations) and the spatially relative descriptors used herein interpreted accordingly. Similarly, the terms "upwardly", "downwardly", "vertical", "horizontal" and the like may be used herein for the purpose of explanation only unless specifically indicated otherwise.

Although the terms "first" and "second" may be used herein to describe various features/elements (including steps or processes), these features/elements should not be limited by these terms as an indication of the order of the features/elements or whether one is primary or more important than the other, unless the context indicates otherwise. These terms may be used to distinguish one feature/element from another feature/element. Thus, a first feature/element discussed could be termed a second feature/element, and similarly, a second feature/element discussed below could be termed a first feature/element without departing from the teachings provided herein.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical values given herein should also be understood to include about or approximately that value, unless the context indicates otherwise.

For example, if the value "10" is disclosed, then "about 10" is also disclosed. Any numerical range recited herein is intended to include all sub-ranges subsumed therein. It is also understood that when a value is disclosed that "less than or equal to" the value, "greater than or equal to the value" and possible ranges between values are also disclosed, as appropriately understood by the skilled artisan. For example, if the value "X" is disclosed the "less than or equal to X" as well as "greater than or equal to X" (e.g., where X is a numerical value) is also disclosed. It is also understood that the throughout the application, data is provided in a number of different formats, and that this data, may represent endpoints or starting points, and ranges for any combination of the data points. For example, if a particular data point "10" and a particular data point "15" may be disclosed, it is understood that greater than, greater than or equal to, less than, less than or equal to, and equal to 10 and 15 may be considered disclosed as well as between 10 and 15. It is also understood that each unit between two particular units may be also disclosed. For example, if 10 and 15 may be disclosed, then 11, 12, 13, and 14 may be also disclosed.

Although various illustrative embodiments have been disclosed, any of a number of changes may be made to various embodiments without departing from the teachings herein. For example, the order in which various described method steps are performed may be changed or reconfigured in different or alternative embodiments, and in other embodiments one or more method steps may be skipped altogether. Optional or desirable features of various device and system embodiments may be included in some embodiments and not in others. Therefore, the foregoing description is provided primarily for the purpose of example and should not be interpreted to limit the scope of the claims and specific embodiments or particular details or features disclosed.

The examples and illustrations included herein show, by way of illustration and not of limitation, specific embodiments in which the disclosed subject matter may be practiced. As mentioned, other embodiments may be utilized and derived therefrom, such that structural and logical substitutions and changes may be made without departing from the scope of this disclosure. Such embodiments of the disclosed subject matter may be referred to herein individually or collectively by the term "invention" merely for convenience and without intending to voluntarily limit the scope of this application to any single invention or inventive concept, if more than one is, in fact, disclosed. Thus, although specific embodiments have been illustrated and described herein, any arrangement calculated to achieve an intended, practical or disclosed purpose, whether explicitly stated or implied, may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The disclosed subject matter has been provided here with reference to one or more features or embodiments. Those skilled in the art will recognize and appreciate that, despite of the detailed nature of the example embodiments provided here, changes and modifications may be applied to said embodiments without limiting or departing from the generally intended scope. These and various other adaptations and combinations of the embodiments provided here are within the scope of the disclosed subject matter as defined by the disclosed elements and features and their full set of equivalents.

A portion of the disclosure of this patent document may contain material, which is subject to copyright protection. The owner has no objection to facsimile reproduction by any one of the patent document or the patent disclosure, as it appears in the Patent and Trademark Office patent file or records, but reserves all copyrights whatsoever. Certain marks referenced herein may be common law or registered trademarks of the applicant, the assignee or third parties affiliated or unaffiliated with the applicant or the assignee. Use of these marks is for providing an enabling disclosure by way of example and shall not be construed to exclusively limit the scope of the disclosed subject matter to material associated with such marks.

What is claimed is:

1. A computer-implemented method comprising:
    receiving application preferences defining one or more attributes associated with input data to be delivered to one or more applications from one or more data sources, a first set of attributes of the one or more attributes being associated with first input data to be delivered to a first application different from a second set of attributes associated with second input data to be delivered to a second application;
    providing the application preferences to a handler in communication with the one or more data sources, the handler receiving raw data in a variety of formats and packet sizes from the one or more data sources;
    packaging the raw data received by the handler into one or more data packets, at least one of the one or more data packets having a size and format that satisfies the application preferences defining the one or more attributes associated with the first input data to be delivered to the first application; and
    transmitting the one or more data packets over one or more data transmission channels by at least buffering the one or more data packets in a first storage media associated with a first data transmission channel of the one or more data transmission channels, at least one of the one or more data transmission channels satisfying the application preferences defining the one or more attributes associated with the first input data to be delivered to the first application, the one or more data sources comprising one or more sensors configured to capture event data generated by an event producing system.

2. The computer-implemented method of claim 1, wherein the first data transmission channel corresponds to the first application invoked to process the transmitted one or more data packets.

3. The computer-implemented method of claim 1, wherein the raw data received by the handler is packaged according to a first timeline enveloping a second timeline defined by the one or more attributes.

4. The computer-implemented method of claim 3, wherein the first timeline is associated with a span in time starting at a first time and ending at a fourth time, wherein the fourth time is greater than the first time.

5. The computer-implemented method of claim 4, wherein the second timeline is associated with a span in time starting at a second time and ending at a third time, wherein the fourth time is greater than the third time, wherein the third time is greater than the second time, and wherein the second time is greater than the first time.

6. The computer-implemented method of claim 5, wherein first raw data packaged by the handler comprises data received for use by the first application during a first window of time starting at the first time and ending at the fourth time, and wherein the first application processes the first input data received during a second window of time starting at the second time and ending at the third time.

7. The computer-implemented method of claim 6, wherein second raw data packaged by the handler comprises data received for use by the first application during a third window of time starting at the third time, and wherein the first window of time and the third window of time at least partially overlap.

8. The computer-implemented method of claim 7, wherein the first window of time and the third window of time at least partially overlap over a fourth time window starting at the third time and ending at the fourth time.

9. The method of claim 8, wherein the handler is in communication with a state tracker configured to track the timelines associated with packaging the raw data, the first raw data, and/or the second raw data received and transmitted by the handler to synchronize data transmission to the one or more applications according to timing data defined by the one or more attributes.

10. The computer-implemented method of claim 1, wherein the one or more data packets is transmitted over the one or more data transmission channels by way of a publication/subscription mechanism, wherein the one or more applications are subscribers and the handler is the publisher.

11. A computer-implemented system comprising:
    at least one programmable processor; and
    a non-transitory machine-readable medium storing instructions that, when executed by the at least one programmable processor, cause the at least one programmable processor to perform operations comprising:
    receiving application preferences defining one or more attributes associated with input data to be delivered to one or more applications from one or more data sources, a first set of attributes of the one or more attributes being associated with first input data to be delivered to a first application different from a second set of attributes associated with second input data to be delivered to a second application;
    providing the application preferences to a handler in communication with the one or more data sources, the handler receiving raw data in a variety of formats and packet sizes from the one or more data sources;

packaging the raw data received by the handler into one or more data packets, at least one of the one or more data packets having a size and format that satisfies the application preferences defining the one or more attributes associated with the first input data to be delivered to the first application; and transmitting the one or more data packets over one or more data transmission channels by at least buffering the one or more data packets in a first storage media associated with a first data transmission channel of the one or more data transmission channels, at least one of the one or more data transmission channels satisfying the application preferences defining the one or more attributes associated with the first input data to be delivered to the first application, the one or more data sources comprising comprise one or more sensors configured to capture event data generated by an event producing system.

12. The computer-implemented system of claim 11, wherein the first data transmission channel corresponds to the first application invoked to process the transmitted one or more data packets.

13. The computer-implemented system of claim 11, wherein the raw data received by the handler is packaged according to a first timeline enveloping a second timeline defined by the one or more attributes.

14. The computer-implemented system of claim 13, wherein the first timeline is associated with a span in time starting at a first time and ending at a fourth time, wherein the fourth time is greater than the first time.

15. The computer-implemented system of claim 14, wherein the second timeline is associated with a span in time starting at a second time and ending at a third time, wherein the fourth time is greater than the third time, wherein the third time is greater than the second time, and wherein the second time is greater than the first time.

16. A non-transitory computer readable storage medium storing instructions that, when executed by at least one processor, causes the at least one processor to perform operations comprising:

receiving application preferences defining one or more attributes associated with input data to be delivered to one or more applications from one or more data sources, a first set of attributes of the one or more attributes being associated with first input data to be delivered to a first application different from a second set of attributes associated with second input data to be delivered to a second application;

providing the application preferences to a handler in communication with the one or more data sources, the handler receiving raw data in a variety of formats and packet sizes from the one or more data sources;

packaging the raw data received by the handler into one or more data packets, at least one of the one or more data packets having a size and format that satisfies the application preferences defining the one or more attributes associated with the first input data to be delivered to the first application; and transmitting the one or more data packets over one or more data transmission channels by at least buffering the one or more data packets in a first storage media associated with a first data transmission channel of the one or more data transmission channels, at least one of the one or more data transmission channels satisfying the application preferences defining the one or more attributes associated with the first input data to be delivered to the first application, the one or more data sources comprising one or more sensors configured to capture event data generated by an event producing system.

17. The non-transitory computer readable storage medium of claim 16, wherein the first data transmission channel corresponds to the first application invoked to process the transmitted one or more data packets.

18. The non-transitory computer readable storage medium of claim 16, wherein the raw data received by the handler is packaged according to a first timeline enveloping a second timeline defined by the one or more attributes.

19. The non-transitory computer readable storage medium of claim 18, wherein the first timeline is associated with a span in time starting at a first time and ending at a fourth time, wherein the fourth time is greater than the first time.

20. The non-transitory computer readable storage medium of claim 19, wherein the second timeline is associated with a span in time starting at a second time and ending at a third time, wherein the fourth time is greater than the third time, wherein the third time is greater than the second time, and wherein the second time is greater than the first time.

* * * * *